US010593575B2

(12) United States Patent
Miner et al.

(10) Patent No.: US 10,593,575 B2
(45) Date of Patent: *Mar. 17, 2020

(54) SYSTEM AND METHOD FOR MONITORING WAFER HANDLING AND A WAFER HANDLING MACHINE

(71) Applicant: GLOBALFOUNDRIES, Inc., Grand Cayman (KY)

(72) Inventors: Stephen B. Miner, Gansevoort, NY (US); William John Fosnight, Saratoga Springs, NY (US); Ryan J. Gallagher, Saratoga Springs, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/223,882

(22) Filed: Jul. 29, 2016

(65) Prior Publication Data

US 2016/0336206 A1  Nov. 17, 2016

Related U.S. Application Data

(62) Division of application No. 13/872,734, filed on Apr. 29, 2013, now Pat. No. 9,442,482.

(51) Int. Cl.
*H01L 21/67* (2006.01)
*H01L 21/687* (2006.01)
(Continued)

(52) U.S. Cl.
CPC .... *H01L 21/67265* (2013.01); *G05B 19/4184* (2013.01); *G05B 19/41875* (2013.01);
(Continued)

(58) Field of Classification Search
CPC .......... G05B 19/41875; G05B 19/4184; G05B 2219/37224; G05B 2219/45031;
(Continued)

(56) References Cited

U.S. PATENT DOCUMENTS 6,801,650 B1  10/2004  Kikuchi et al.
7,085,622 B2 *  8/2006  Sadighi .................. B25J 9/1697
250/559.45
(Continued)

FOREIGN PATENT DOCUMENTS

CN  1759478 A  4/2006
CN  101263499 A  3/2013
(Continued)

OTHER PUBLICATIONS

The European Patent Office, European Search Report in European Patent Application No. EP 17 15 5850 dated Mar. 8, 2017.
(Continued)

*Primary Examiner* — Charles R Kasenge
(74) *Attorney, Agent, or Firm* — Francois Pagette; Hoffman Warnick LLC

(57) ABSTRACT

Systems, machines, and methods for monitoring wafer handling are disclosed herein. A system for monitoring wafer handling includes a sensor and a controller. The sensor is capable of being secured to an assembled wafer handling machine. The controller is in electronic communication with the sensor and includes control logic. The control logic is configured to store a reference output of the sensor when the wafer handling machine is aligned and is configured to generate an indication signal when a difference between the reference output and a current output of the sensor exceeds a threshold.

15 Claims, 4 Drawing Sheets

(51) Int. Cl.
*H01L 21/673* (2006.01)
*G05B 19/418* (2006.01)
*H01L 21/68* (2006.01)

(52) U.S. Cl.
CPC .. *H01L 21/67259* (2013.01); *H01L 21/67389* (2013.01); *H01L 21/68* (2013.01); *H01L 21/68707* (2013.01); *G05B 2219/37224* (2013.01); *G05B 2219/45031* (2013.01); *Y02P 90/04* (2015.11); *Y10S 901/02* (2013.01); *Y10S 901/27* (2013.01)

(58) Field of Classification Search
CPC ............... H01L 21/68; H01L 21/67259; H01L 21/67265; H01L 21/68707; H01L 21/67389; Y10S 901/27; Y10S 901/02; Y02P 90/04
See application file for complete search history.

(56) References Cited

U.S. PATENT DOCUMENTS

| | | | | |
|---|---|---|---|---|
| 7,233,841 | B2* | 6/2007 | Sadighi | B25J 9/1692 250/559.45 |
| 7,627,395 | B2* | 12/2009 | Sadighi | B25J 9/1692 250/559.45 |
| 7,882,394 | B2 | 2/2011 | Hosek et al. | |
| 9,442,482 | B2* | 9/2016 | Miner | H01L 21/67259 |
| 2003/0198376 | A1* | 10/2003 | Sadighi | B25J 9/1697 382/153 |
| 2003/0202092 | A1* | 10/2003 | Sadighi | B25J 9/1692 348/87 |
| 2004/0068347 | A1 | 4/2004 | Aalund et al. | |
| 2004/0202362 | A1 | 10/2004 | Ishikawa et al. | |
| 2005/0016818 | A1* | 1/2005 | Ito | B05B 13/0228 198/345.1 |
| 2005/0123386 | A1 | 6/2005 | Nishimura et al. | |
| 2005/0276920 | A1* | 12/2005 | Kim | H01L 21/67259 427/240 |
| 2006/0215347 | A1 | 9/2006 | Wakabayashi | |
| 2007/0067678 | A1 | 3/2007 | Hosek et al. | |
| 2007/0112465 | A1* | 5/2007 | Sadighi | B25J 9/1692 700/254 |
| 2009/0024238 | A1* | 1/2009 | Sueyoshi | G05B 19/409 700/108 |
| 2009/0062959 | A1* | 3/2009 | Sakhare | B25J 9/1692 700/254 |
| 2009/0062960 | A1 | 3/2009 | Krishnasamy et al. | |
| 2011/0031091 | A1* | 2/2011 | Fatula, Jr. | B66C 1/663 198/463.3 |
| 2011/0173496 | A1 | 7/2011 | Hosek et al. | |
| 2011/0248190 | A1* | 10/2011 | Tanaka | H01J 37/20 250/492.21 |

FOREIGN PATENT DOCUMENTS

| | | |
|---|---|---|
| EP | 0597637 A1 | 5/1994 |
| JP | H109232404 A | 9/1997 |
| JP | H110313037 A | 11/1998 |
| JP | 2000148994 A | 5/2000 |
| JP | 2005175083 A | 6/2005 |
| JP | 2006278396 A | 10/2006 |
| JP | 2009229184 A | 10/2009 |
| JP | 2009233788 A | 10/2009 |
| JP | 2010016826 A | 1/2010 |
| JP | 2011176197 A | 9/2011 |
| JP | 2011192676 A | 9/2011 |
| TW | 451056 B | 8/2001 |

OTHER PUBLICATIONS

The Taiwanese Intellectual Property Office, Rejection Decision in Taiwanese Patent Application No. 102146556 dated Oct. 27, 2016.
European Patent Office, Extended European Search Report for European Patent Application No. 14 166 341.9, dated Sep. 16, 2014.
European Patent Office, Communication pursuant to Article 94(3) EPC for Application No. 14 166 341.9-1556 dated May 18, 2015.
European Patent Office, Communication pursuant to Article 94(3) EPC in Application No. 14 166 341.9-1556 dated Oct. 15, 2015.
European Patent Office, Communication pursuant to Article 94(3) EPC in Application No. 14 166 341.9-1556 dated Apr. 8, 2016.
Intellectual Property Office, Examination Report for Taiwanese Patent Application No. 102146556 dated May 11, 2015.
Intellectual Property Office, Second Examination Report (Final Notice) for Taiwanese Patent Application No. 102146556 dated Apr. 22, 2016.
The Korean Intellectual Property Office, Notice of Office Action in Korean Patent Application No. 10-2014-0027372 dated Aug. 26, 2015.
He Korean Intellectual Property Office, Notice of Office Action in Korean Patent Application No. 10-2014-0027372 dated Apr. 26, 2016.
Chinese Intellectual Property Office, Second Office Action for Chinese Patent Application No. 201410178064.0, dated Mar. 30, 2017.
The Korean Intellectual Property Office, Decision of Rejection in Korean Patent Application No. 10-2014-0027372 dated Mar. 16, 2017.
The Chinese Intellectual Property Office, Notice of Office Action in Chinese Patent Application No. 201410178064.0 dated Aug. 2, 2016 and English Translation.
The Taiwanese Intellectual Property Office, Examination Report in Taiwanese Patent Application No. 102146556 dated Jul. 23, 2018 and Search Report dated Mar. 25, 2018.
Japanese Intellectual Property Office, Office Action for Japanese Patent Application No. 2014-085665, dated Feb. 6, 2018 and English translation.
International Search Report issued in connection with corresponding Japanese Application No. 2014-085665, dated Jan. 10, 2018, 41 pages.
Related Korean Patent Application No. 10-2017-0075038, Office Action dated Nov. 26, 2019, (GFF-0329-KR-DIV), 6 pages.

* cited by examiner

SYSTEM AND METHOD FOR MONITORING WAFER HANDLING AND A WAFER HANDLING MACHINE

CROSS-REFERENCE TO RELATED APPLICATIONS

This application is a divisional of U.S. patent application Ser. No. 13/872,734 filed on Apr. 29, 2013. The disclosure of the above application is incorporated herein by reference.

TECHNICAL FIELD

The present disclosure relates to semiconductor wafer handling. More particularly, the present disclosure relates to monitoring machine alignment to detect potential scratches during semiconductor wafer handling.

BACKGROUND

Manufacturing of integrated circuits and other microdevices involves a variety of process steps that are performed in various machines. A thin slice of semiconductor material (a wafer) is typically moved or handed off between the different machines using a robotic wafer handler. Components of the robotic wafer handler may become misaligned due to component wear or accidental human interference. For example, a 0.1 degree tilt on a component of the wafer handler may result in a robotic arm scratching the wafer during handling.

Scratched wafers are typically discarded, resulting in lost tool time and materials. Furthermore, a typical wafer processing sequence may not detect the scratch until several process steps later when the wafer is examined. During the several process steps hundreds of wafers may have already been scratched by the misaligned tool.

Additional steps may be added to check whether a tool is scratching. The additional steps are typically performed on a weekly basis using wafers and a defect tool. These steps cost cycle time and wafers, and may still result in undetected scratches for a period of time. During the period of scratching, thousands of wafers may be scratched. Increasing the frequency of the additional steps causes even more tool time to be lost.

Accordingly, it is desirable to provide a system and method for monitoring wafer handling for potential wafer scratches. In addition, it is desirable to provide an improved wafer handling machine. Furthermore, other desirable features and characteristics will become apparent from the subsequent detailed description and the appended claims, taken in conjunction with the accompanying drawings, brief summary, and this background.

BRIEF SUMMARY

Systems, machines, and methods for monitoring wafer handling are disclosed herein. In one embodiment, a system for monitoring wafer handling includes a sensor and a controller. The sensor is configured to be secured to an assembled wafer handling machine. The controller is in electronic communication with the sensor and includes control logic. The control logic is configured to store a reference output of the sensor when the wafer handling machine is aligned and is configured to generate an indication signal when a difference between the reference output and a current output of the sensor exceeds a threshold.

In another exemplary embodiment, a wafer handling machine includes a load port, a robotic arm, a sensor, a controller, and an automation control module. The load port is capable of holding wafers and the robotic arm is capable of picking up and moving the wafers. The sensor is secured to an outside of at least one of the load port and the robotic arm. The controller includes control logic to store a reference output of the sensor when the wafer handling machine is aligned and to generate an indication signal when a difference between the reference output and a current output of the sensor exceeds a threshold. The automation control module is configured to control movement of the robotic arm and is separate from the controller.

In another exemplary embodiment, a method of monitoring wafer handling is provided. The method includes storing a reference output of a sensor that is secured to a wafer handling machine when the wafer handling machine is aligned, and generating an indication signal when a difference between the reference output and a current output of the sensor exceeds a threshold.

BRIEF DESCRIPTION OF THE DRAWINGS

Exemplary embodiments of the present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance or illustration." Any implementation described herein as exemplary is not necessarily to be construed as preferred or advantageous over other implementations. Furthermore, there is no intention to be bound by any expressed or implied theory presented in the preceding Technical Field, Background, Brief Summary or the following Detailed Description The following description refers to elements or nodes or features being "connected or "coupled" together. As used herein, unless expressly stated otherwise, "coupled" means that one element/node/feature is directly joined to (or directly or indirectly communicates with) another element/node/feature, and not necessarily mechanically. Likewise, unless expressly stated otherwise, "connect" means that one element/node feature is directly joined to (or directly communicates with) another element/node/feature, and not necessarily mechanically.

In general, embodiments provided herein utilize tilt sensors and displacement sensors to verify that frames of wafer tools, chambers, and loadports stay in alignment. Wafer scratching from misaligned tools may therefore be reduced. The system may be used with a wide variety of wafer handling machines that have different components and configurations.

Figure 1:
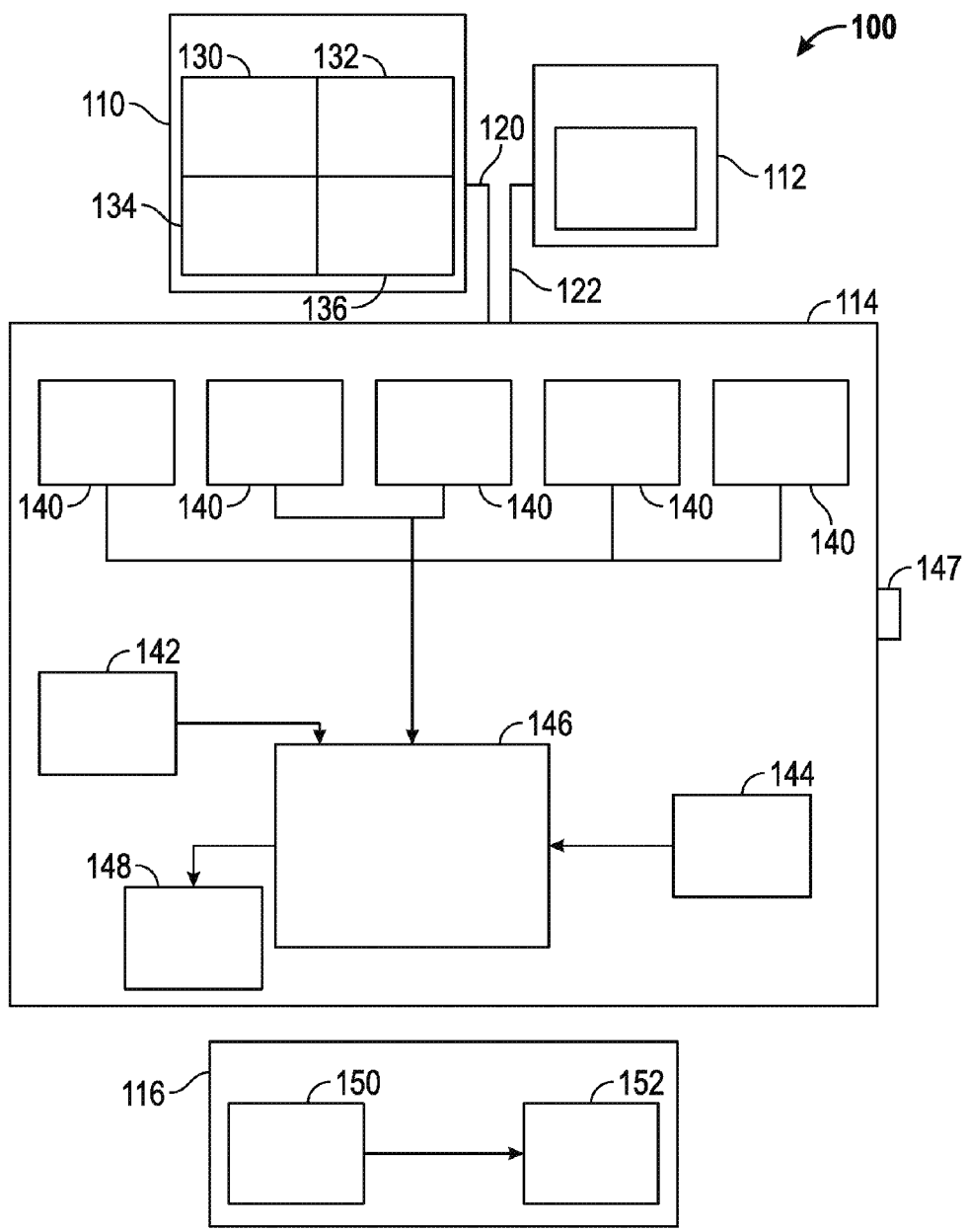
FIG. 1 is a block diagram of a monitoring system in accordance with some embodiments.

FIG. 1 illustrates a block diagram of a monitoring system 100 according to some embodiments. The monitoring system 100 includes sensors 110, an imaging device 112, and a controller 114. The monitoring system 100 may be in wireless communication with factory automation infrastructure 116. The sensors 110 electronically communicate with the controller 114 through a first interconnect 120 and the imaging device 112 electronically communicates with the controller 114 through a second interconnect 122. In the example provided, the interconnects 120, 122 are insulated electrically conductive groups of wires. For example, each sensor may have a separate wire in the interconnect 120 for separate communication with the controller 114. It should be appreciated that the sensors 110 and the imaging device 112 may communicate with the controller 114 in other ways, such as by wireless communication, without departing from the scope of the present disclosure.

The sensors 110 are configured to be secured to a wafer handling machine used for semiconductor device fabrication, as will be described below. The sensors 110 in the example provided include level or tilt sensors 130, temperature sensors 132, vibration sensors 134, and harmonics sensors 136. The sensors 110 permit near real time scratch detection. For example, the vibration sensors 134 may detect when a robot is vibrating and may cause scratching. The harmonics sensors 136 may be used to determine if the acoustics of the machine are changing over time, which may indicate a risk of misalignment and wafer scratches. The different sensors 130, 132, 134, 136 may be provided separately or may be packaged together in one sensor housing. In some embodiments, only the tilt sensors 130 are utilized.

In some embodiments, the sensors 110 are micro-electromechanical systems (MEMS) sensors. The sensors 110 generate output signals to the first interconnect 120 for analysis by the controller 114. For example, a tilt sensor 130 may generate an analog voltage or current signal that indicates the orientation of the level sensor 130 with respect to Earth's gravitational pull. The magnitude of the generated signal may then be analyzed by the controller 114 to determine when the alignment of the wafer handling machine has changed.

The imaging device 112 is configured to be secured to the wafer handling machine and capture images at the same portion of different handling cycles. For example, the imaging device 112 may capture an image of a robotic arm each time the arm enters a load port, as will be described below. The captured images may be analyzed by the controller 114 to determine when a height of a component of the wafer handling machine is out of alignment. For example, worm gears or ball screws may wear out and cause the vertical alignment of a robotic arm to vary from a reference height.

In the example provided, the imaging device 112 is a charge-coupled device (CCD) camera. The imaging device 112 generates a signal on the second interconnect 122 to transfer digital images to the controller 114 for analysis. It should be appreciated that the imaging device 112 may transfer single images or may transfer substantially continuous video without departing from the scope of the present disclosure. In some embodiments, the image comparing capabilities of the controller 114 (described below) are incorporated into the imaging device 112.

The controller 114 receives signals generated by the sensors 110 and the imaging device 112 for analyzing changes in the alignment of the wafer handling machine. The controller 114 includes sensor inputs 140, an imaging device input 142, a power supply 144, control logic 146, a reference capture button 147, and a wireless modem 148. The sensor inputs 140 are electronically coupled to the sensors 110 to receive the output signals generated by the sensors 110. For example, the sensor inputs 140 may receive analog outputs generated by the tilt sensors 130 that indicate a tilt angle of the tilt sensors 130. The imaging device input 142 is electronically coupled with the imaging device 112 to receive the images generated by the imaging device 112. For example, the imaging device input 142 may receive digital images from the imaging device 112 that indicate a height of a robotic arm of the wafer handling machine.

The control logic 146 may include any control circuitry capable of performing the various tasks described below. For example, the control logic 146 may include an application specific integrated circuit (ASIC), an electronic circuit, a processor (shared, dedicated, or group) and memory that execute one or more software or firmware programs, a combinational logic circuit, and/or other suitable components that provide the described functionality. In some embodiments, the control logic 146 may be hardware-based logic, or may include a combination of hardware, firmware, and/or software elements.

The control logic 146 is configured to perform at least some of the operations described below with reference to FIG. 3. For example, the control logic 146 may capture and store reference outputs from the sensors 110 and the imaging device 112 when the reference capture button 147 is pressed. The control logic 146 further compares the output signals of the sensors 110 and imaging device 112 with the stored reference outputs. When a difference between the reference outputs and a current output generated by the sensors 110 exceeds a threshold, the control logic 146 generates in indication signal.

Storing the reference outputs and comparing current values to the reference outputs reduces the need for costly calibration procedures where the sensors are configured to provide the level of the sensor with respect to the Z direction. For example, referring momentarily to FIG. 2, the technician may manually align a column 222 and a load port 212 so that both the column 222 and the load port 212 are at the same slight angle with respect to the Z direction. Such an alignment does not lead to scratching of the wafer during handling and is therefore suitable for a stored reference output.

Referring back to FIG. 1, the wireless modem 148 sends the indication signal to a wireless modem 150 in the infrastructure 116. It should be appreciated that the wireless modems 148, 150 may utilize any suitable wireless protocol. In some embodiments, the wireless modems 148, 150 are replaced with wired network communications.

The monitoring application 152 of the infrastructure 116 sends alerts and inhibits further wafer delivery to the wafer handling machine from which the indication signal originated. For example, the monitoring application 152 may page, email, text, or otherwise alert a technician that the wafer handling machine should be serviced. Inhibiting further wafer delivery may include routing all continuing production to a different wafer handling machine or load port.

Figure 2A:
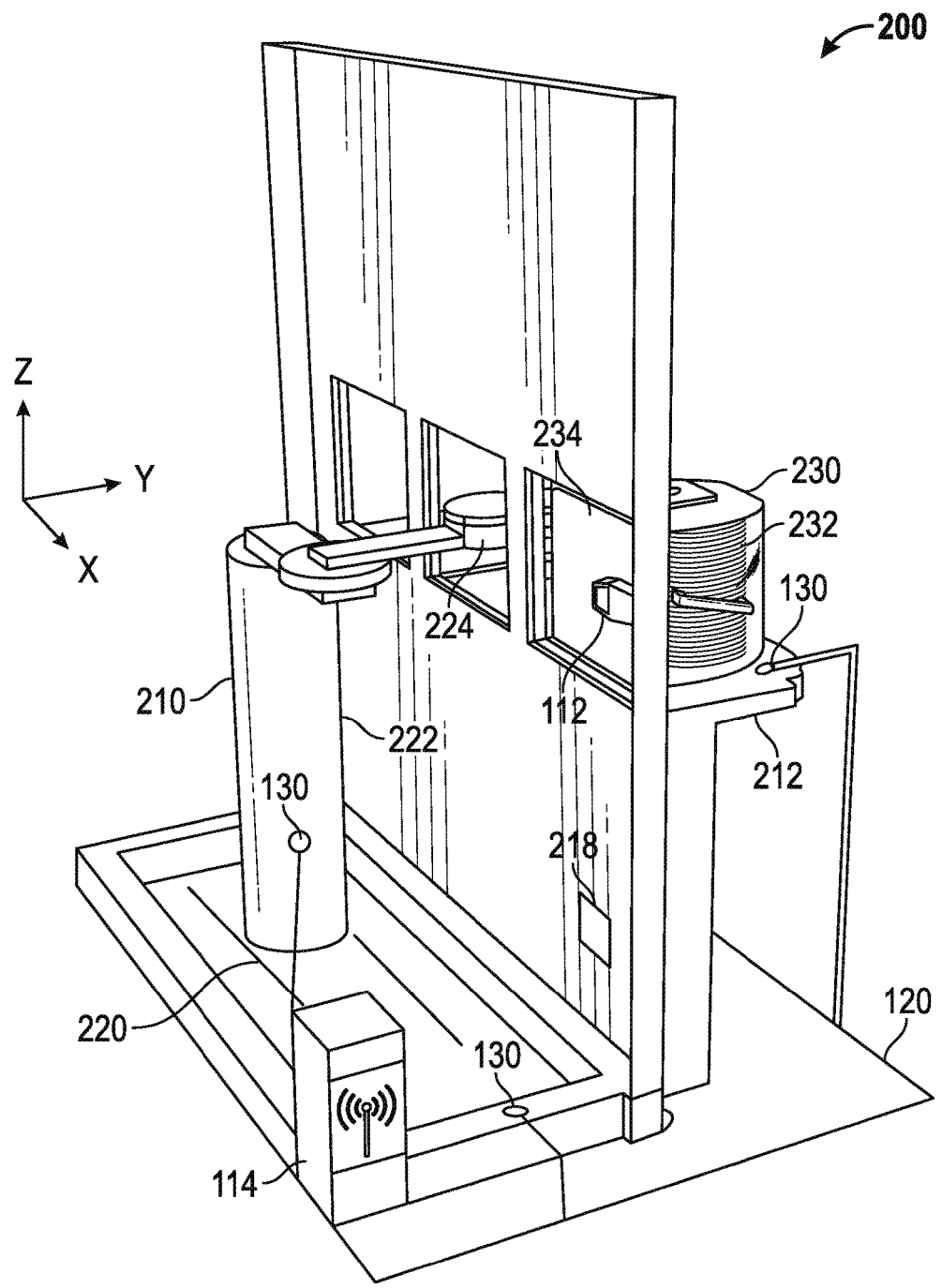
FIG. 2A and FIG. 2B are isometric views of a wafer handling machine including the monitoring system of FIG. 1 in accordance with some embodiments.
Figure 2B:
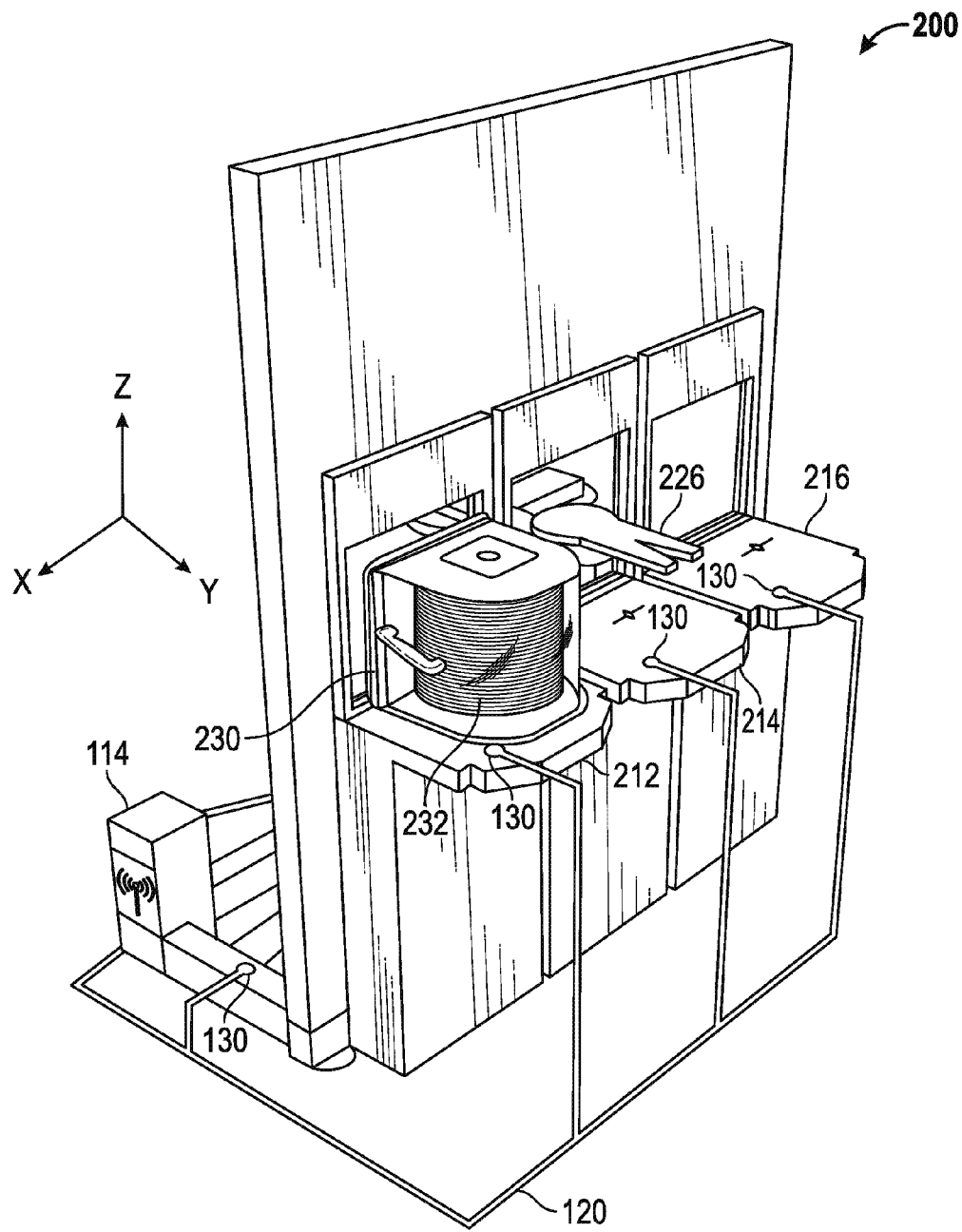

Referring now to FIGS. 2A and 2B, isometric views of an equipment front end module (EFEM) 200 incorporating the monitoring system 100 are illustrated in accordance with some embodiments. In general, the EFEM 200 is a wafer handling machine for loading semiconductor wafers into various processing equipment. For example, the EFEM 200 may load wafers into processing tools for vacuum processing, metrology stages to take measurements on the wafer, wet sinks to wash off the wafer, etc. It should be appreciated that the monitoring system 100 may be incorporated on any equipment where wafers are handled (e.g., robots inside tools, processing chucks, etc.) without departing from the scope of the present disclosure.

The EFEM 200 includes a robotic arm 210, a first load port 212, a second load port 214, a third load port 216, and an automation control module 218 for controlling movement of the robotic arm The robotic arm 210 includes a track 220, a column 222, and an end effector 224. The robotic arm 210 translates along an X axis on the track 220 to access each of the load ports 212, 214, 216. The column 222 compresses and expands to translate the end effector 224 along a Z axis. The column 222 also rotates to translate the end effector 224 along a Y axis.

During operation of the EFEM 200, front opening unified pods (FOUPs) 230 are placed on the load ports 212, 214, 216. The FOUPs 230 each initially include stacked semiconductor wafers 232 and a door 234. The semiconductor wafers 232 may be, for example, slices of crystalline silicon in various stages of semiconductor fabrication processing. The door 234 may be opened by a mechanism in the load port on which the FOUP 230 is placed. The wafers 232 are spaced apart in the vertical direction to permit the end effector 224 to enter the FOUP 230 between the wafers 232 for removing the topmost wafer 232. In order to prevent the end effector 224 from scratching the wafers, the EFEM 200 components are aligned by a technician before use.

The tilt sensors 130 may be secured to various components of the EFEM 200 to monitor the alignment of the components. The sensors 130 may be secured in any suitable fashion. In some embodiments, the sensors 130 are secured to the EFEM 200 after final assembly of the EFEM 200. Accordingly, the sensors 130 are configured to be secured to any component of a variety of machines that may already be utilized in a factory. In the example provided, the tilt sensors 130 are secured to the outside of the components of the EFEM 200 using adhesive strips. In the example provided, the tilt sensors 130 are secured to the column 222, a base of the EFEM 200, and each of the load ports 212, 214, 216. The imaging device 112 is secured to the EFEM 200 adjacent to where the end effector 224 enters the load ports.

The independence of the controller 114 from the automation control module 218 promotes use of the system 100 on various machines. For example, the controller 114 is not limited by the type of software used by the manufacturer of the EFEM 200 to indicate misalignment. In some embodiments, the system 100 is transported between different machines within a factory that each include different automation control modules.

Figure 3:
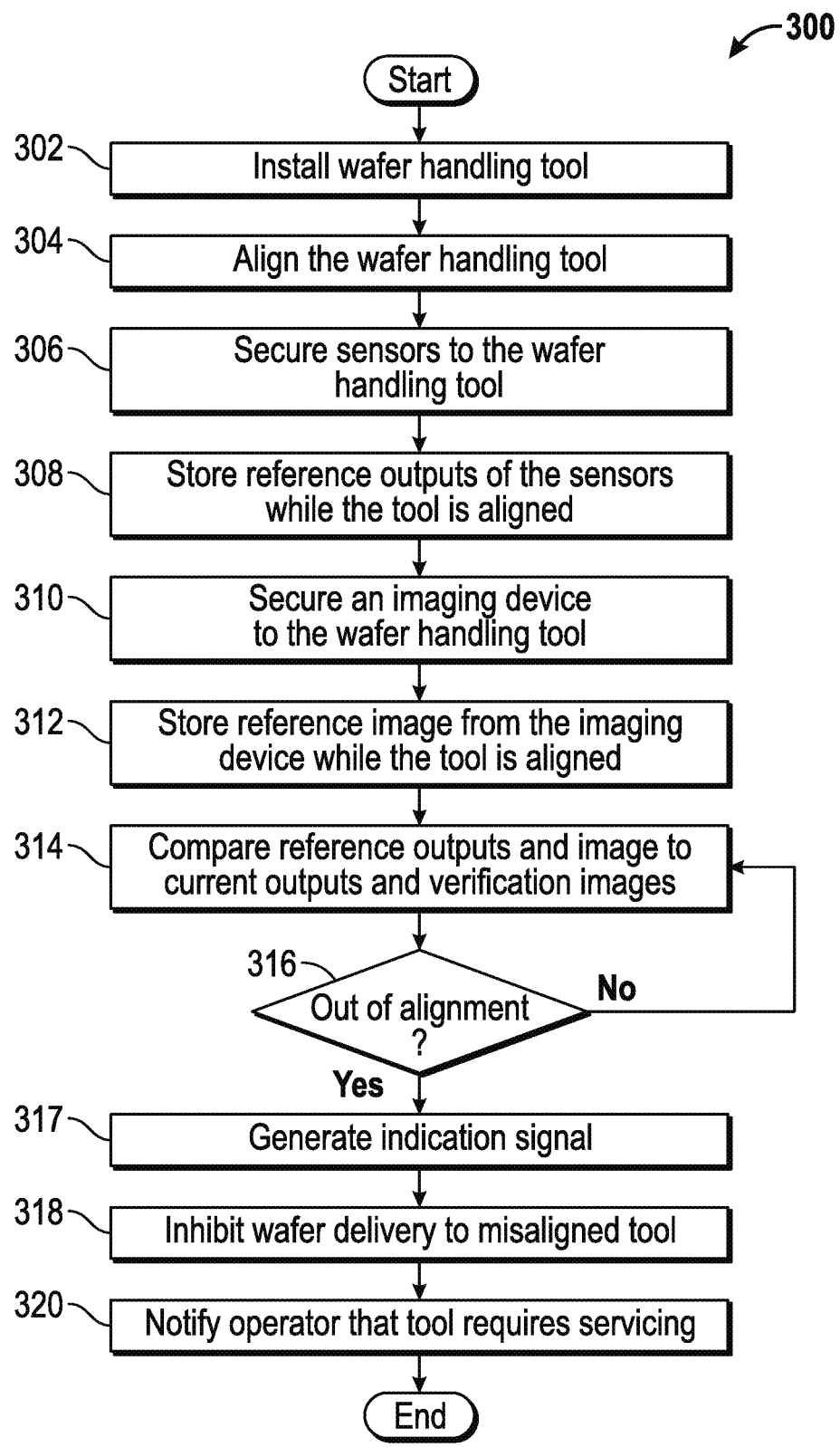
FIG. 3 is a flow diagram of a method for monitoring wafer handling in accordance with some embodiments.

Referring now to FIG. 3, a method 300 of monitoring wafer handling is presented in flow diagram form in accordance with some embodiments. In operation 302 a wafer handling tool is installed. For example, the fully assembled EFEM 200 may be installed in a factory. In the example provided, the wafer handling machine has no built-in alignment sensing capability. In operation 304 the wafer handling tool is aligned. For example, a technician may manually level each component of the tool using levels or other equipment.

Sensors are secured to the assembled wafer handling tool in operation 306. For example, the technician may secure the sensors 110 to the EFEM 200 using adhesive strips. The sensors 110 may be secured to any component of the wafer handling tool. For example, the tilt sensors 130 may be secured to the column 222, the base, and the load ports 212, 214, 216 of the EFEM 200. The modular nature and manufacturer independent nature of the system 100 promote retrofitting tools that are already used in production.

In operation 308 reference outputs are captured and stored while the wafer handling machine is aligned. For example, the technician may press the reference capture button 147 to indicate that the EFEM 200 is aligned. The controller 114 may then store the outputs generated by the sensors 110 at the time the button 147 was pressed. As previously described, the output generated by the tilt sensors 130 corresponds to an angle of the tilt sensors 130, and therefore an angle of the column 122 or the load port 212, 214, 216.

In operation 310 an imaging device is secured to the wafer handling tool. For example, the imaging device 112 may be secured to the EFEM 200 adjacent to the load port 212. In operation 312 a reference image is captured and stored while the tool is aligned. For example, when the reference capture button 147 is pressed the controller 114 may store the reference image at a portion of the handling cycle where the end effector 224 enters the load port 214.

In operation 314 the reference outputs and the reference image are compared to current outputs from the sensors and verification images from the imaging device. For example, the controller 114 may calculate a difference between the reference output of the sensors 110 and an output currently generated by the sensors 110. Similarly, the controller 114 may compare the reference image stored in operation 312 with verification images captured each time the end effector 224 enters the load port 214 at the portion of a current handling cycle. Accordingly, the controller 114 is able to compare the current location of the end effector 224 to the taught reference location of the end effector 224 to determine if the end effector 224 is misaligned in the Z direction.

Operation 316 determines whether the tool is out of alignment. For example, the controller 114 may determine the tool is out of alignment when a difference between one of the reference outputs and a current output of at least one of the sensors exceeds a threshold. In some embodiments, the threshold for the tilt sensors 130 corresponds to a 0.1 degree variation from the aligned position.

When the tool is not out of alignment, operation 314 is repeated to continuously monitor the alignment of the tool. When the tool is out of alignment, an indication signal is generated in operation 317. For example, the controller 114 may generate the indication signal and communicate the indication signal to the factory automation infrastructure 116 using the wireless modem 148.

Wafer delivery to the misaligned tool is inhibited in operation 318. For example, the control logic 146 of the controller 114 may instruct the factory automation infrastructure 116 to re-route further wafer delivery from the first load port 212 to the second and third load ports 214, 216 when the first load port 212 is misaligned. In some embodiments, the infrastructure 116 re-routes further wafer delivery to different machines when the column 222 is out of alignment.

In operation 320 an operator is notified that the tool requires servicing. For example, the controller 114 or the infrastructure 116 may generate an email, a text, a page, or other notification for the technician. It should be appreciated that any suitable type of notification may be incorporated without departing from the scope of the present disclosure.

Embodiments provided herein exhibit beneficial attributes for wafer handling monitoring. Scratches during wafer handling may be reduced by utilizing the modular monitoring system on existing machines. The modular nature of the system promotes portability and utilization on different machines through the life of the system. Storing reference levels while the machine is aligned reduces reliance on costly calibration services offered by tool manufacturers.

Additionally, the systems and methods permit near real-time monitoring of tool alignment from a central location.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

The invention claimed is:

1. A system for monitoring wafer handling, the system comprising:
 a sensor capable of being secured to a wafer handling machine, wherein the sensor is a tilt sensor configured to be secured to the wafer handling machine;
 an imaging device; and
 a controller in electronic communication with the sensor and including control logic to:
  store a reference output of the sensor when the wafer handling machine is aligned;
  store a reference image from the imaging device that indicates a reference position of a component of the wafer handling machine during a portion of a handling cycle;
  capture a verification image from the imaging device during the portion of another handling cycle; and
  generate an indication signal when a difference between the reference output and a current output of the sensor during a wafer handling cycle in which the wafer handling machine is handling a wafer exceeds a threshold and based on a difference between the reference image and the verification image,
  wherein the control logic is configured to store the reference output and generate the indication signal independent of signals from an automation control module of the wafer handling machine.

2. The system of claim 1, wherein the controller is independent of the automation control module of the wafer handling machine.

3. The system of claim 1, wherein the tilt sensor is a first tilt sensor, and wherein the system further comprises a second tilt sensor configured to be secured to the wafer handling machine.

4. The system of claim 1, wherein the sensor comprises a plurality of sensors including at least one of a vibration sensor, a temperature sensor, and a harmonics sensor.

5. The system of claim 1, wherein the control logic is further configured to command inhibition of automated delivery of semiconductor wafers to the wafer handling machine based on the indication signal.

6. The system of claim 1, wherein the controller further includes a button, and wherein the control logic is further configured to store the reference output when the button is pressed based entirely on output from the sensor.

7. A wafer processing system comprising:
 a wafer handling machine having a robotic arm and an automation control module, wherein the automation control module is configured to control movement of the robotic arm to move wafers into and out of the wafer handling machine; and
 a monitoring system independent of the wafer handling machine, the monitoring system comprising:
  a sensor secured to the wafer handling machine, wherein the sensor is a tilt sensor;
  an imaging device; and
  a controller in electronic communication with the sensor and independent of the automation control module, the controller including control logic to:
   store a reference image from the imaging device that indicates a reference position of a component of the wafer handling machine during a portion of a handling cycle;
   capture a verification image from the imaging device during the portion of another handling cycle;
   store a reference output of the sensor when the wafer handling machine is aligned; and
   generate an indication signal when a difference between the reference output and a current output of the sensor during a wafer handling cycle in which the wafer handling machine is handling a wafer exceeds a threshold and based on a difference between the reference image and the verification image.

8. The wafer processing system of claim 7, further comprising an infrastructure configured to deliver semiconductor wafers to the wafer handling machine; and wherein the control logic is configured to communicate with the infrastructure to command inhibition of automated delivery of the semiconductor wafers to the wafer handling machine based on the indication signal.

9. The wafer processing system of claim 7, wherein the tilt sensor is a first tilt sensor, and wherein the monitoring system further comprises a second tilt sensor.

10. The wafer processing system of claim 7, wherein the sensor comprises a plurality of sensors including at least one of a vibration sensor, a temperature sensor, and a harmonics sensor.

11. The wafer processing system of claim 7, wherein the controller further includes a button, and wherein the control logic is further configured to store the reference output in response to a press of the button and based entirely on an output of the sensor.

12. A method of monitoring wafer handling, the method comprising:
 storing a reference output of a sensor when a wafer handling machine is aligned independent of an automation control module of the wafer handling machine, wherein the sensor is secured to the wafer handling machine;
 storing a reference image from an imaging device that indicates a reference position of a component of the wafer handling machine during a portion of a handling cycle;
 capturing a verification image from the imaging device during the portion of another handling cycle;
 generating an indication signal when a difference between the reference output and a current output of the sensor during a wafer handling cycle in which the wafer handling machine is handling a wafer exceeds a threshold and based on a difference between the reference image and the verification image and based in no part on signals from the automation control module, and
 inhibiting, with factory automation infrastructure, automated delivery of semiconductor wafers to the wafer handling machine based on the indication signal.

13. The method of claim 12, further comprising securing the sensor to a component of an assembled semiconductor wafer handling machine.

14. The method of claim 13, wherein securing the sensor further includes securing at least one of a tilt sensor, a vibration sensor, a temperature sensor, and a harmonics sensor.

15. The method of claim 12, further comprising securing a first tilt sensor to a robotic arm of the wafer handling machine and includes securing a second tilt sensor to a load port of the wafer handling machine.

* * * * *